United States Patent [19]

Takakura et al.

[11] Patent Number: 5,254,994
[45] Date of Patent: Oct. 19, 1993

[54] CURRENT SOURCE CELL USE IN CURRENT SEGMENT TYPE D AND A CONVERTER

[75] Inventors: Hiroshi Takakura; Junkei Goto, both of Kawasaki, Japan

[73] Assignee: Kabushiki Kaisha Toshiba, Kawasaki, Japan

[21] Appl. No.: 845,652

[22] Filed: Mar. 4, 1992

[30] Foreign Application Priority Data

Mar. 6, 1991 [JP] Japan .................. 3-040124
Apr. 8, 1991 [JP] Japan .................. 3-075209

[51] Int. Cl.⁵ ............................................. H03M 1/66
[52] U.S. Cl. ........................................ 341/153; 341/133
[58] Field of Search .............. 341/133, 134, 135, 136, 341/144, 153; 323/312, 315, 316; 307/246, 491, 572, 571

[56] References Cited

U.S. PATENT DOCUMENTS

| | | | |
|---|---|---|---|
| 3,651,517 | 3/1972 | Kurek et al. | 341/136 |
| 4,415,815 | 11/1983 | Dijkmans et al. | 307/246 |
| 4,587,477 | 5/1986 | Hornak et al. | 341/136 X |
| 4,638,241 | 1/1987 | Colles | 323/312 |
| 4,827,260 | 5/1989 | Sugawa et al. | 341/144 X |
| 5,148,065 | 9/1992 | Krenik et al. | 307/572 |

OTHER PUBLICATIONS

An 80-MHz 8-Bit CMOS D/A Converter, T. Miki et al., IEEE Journal of Solid-State Circuits, vol. sc-21, No. 6, Dec. 1986, pp. 983-988.

*Primary Examiner*—Howard L. Williams
*Attorney, Agent, or Firm*—Finnegan, Henderson, Farabow, Garrett & Dunner

[57] ABSTRACT

A segment control type D to A converter includes a decoder and a plurality of current source cells. The decoder decodes a digital input signal to generate a control signal. The plurality of current source cells are selected by the control signal output from the decoder. A current output from the selected current source cell is output from an output terminal. Each of the current source cells includes first and second transistors. One terminal of the current path of the first transistor is connected to a constant current source, and the first transistor is ON/OFF controlled such that the gate of the transistor receives the control signal output from the decoder. One terminal of the current path of the second transistor is connected to the other terminal of the current path of the first transistor, and the other terminal of the second transistor is connected to the output terminal. A reference voltage is applied to the gate of the second transistor to cause the second transistor to be normally set in an ON state.

10 Claims, 12 Drawing Sheets

| D0 D1 D2 D3 | SD-1 | SD-2 | SD-3 | SD-4 | --- | SD-14 | SD-15 | Iout(μA) | Vout(V) |
|---|---|---|---|---|---|---|---|---|---|
| 0 0 0 0 | 0 | 0 | 0 | 0 | --- | 0 | 0 | 0(0×Io) | 5 |
| 1 0 0 0 | 1 | 0 | 0 | 0 | --- | 0 | 0 | 100 | 4.9 |
| 0 1 0 0 | 1 | 1 | 0 | 0 | --- | 0 | 0 | 200 | 4.8 |
| 1 1 0 0 | 1 | 1 | 1 | 0 | --- | 0 | 0 | 300 | 4.7 |
| 0 0 1 0 | 1 | 1 | 1 | 1 | --- | 0 | 0 | 400 | 4.6 |
| ⋮ | ⋮ | ⋮ | ⋮ | ⋮ | | ⋮ | ⋮ | ⋮ | ⋮ |
| 0 1 1 1 | 1 | 1 | 1 | 1 | --- | 1 | 0 | 1400 | 3.6 |
| 1 1 1 1 | 1 | 1 | 1 | 1 | --- | 1 | 1 | 1500 | 3.5 |

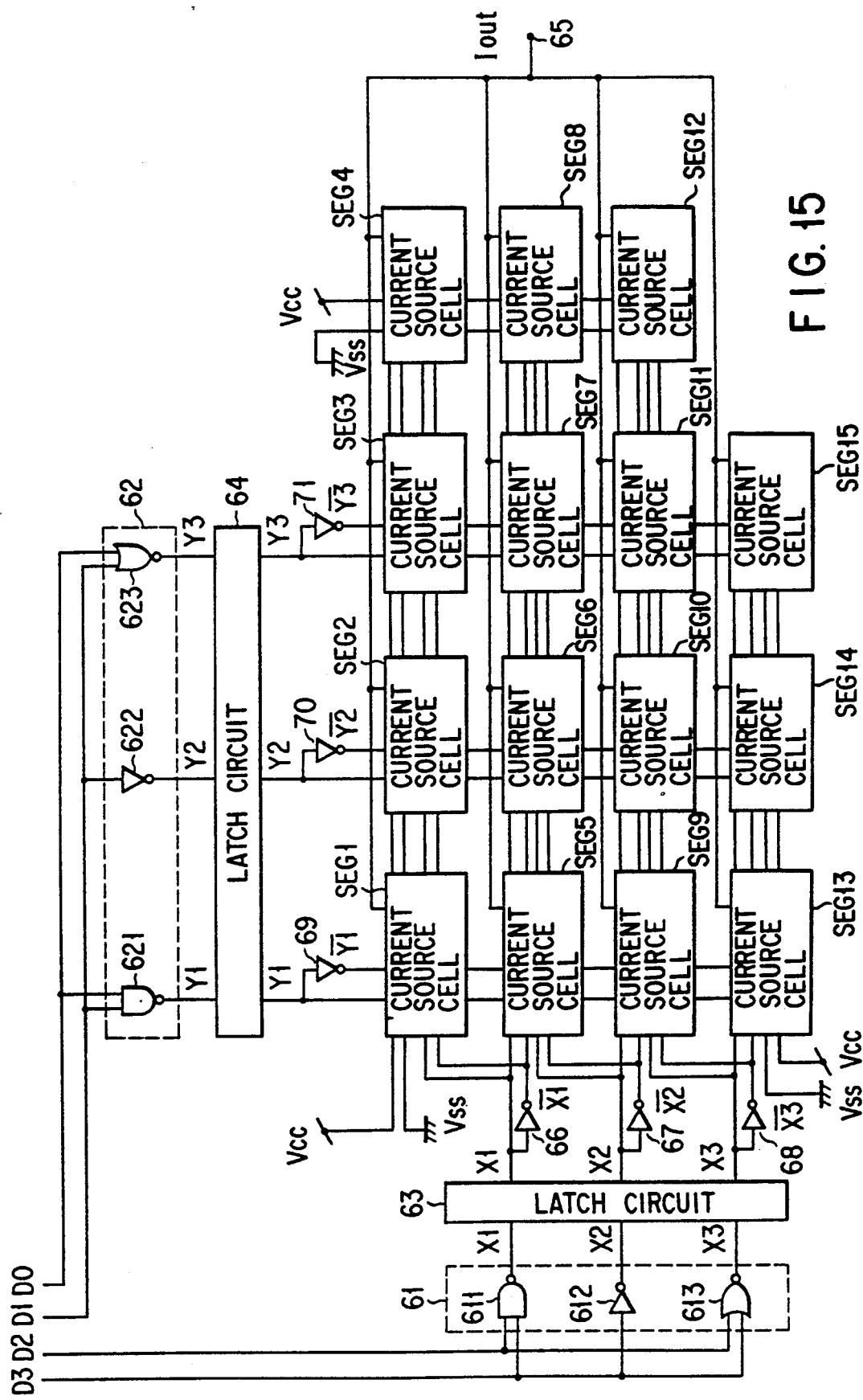
F I G. 15

| Xi | Xi+1 | Yi | $\overline{Xi}$ | $\overline{Xi+1}$ | $\overline{Yi}$ | SW | DSW |
|---|---|---|---|---|---|---|---|
| 0 | 0 | 0 | 1 | 1 | 1 | ON | OFF |
| 0 | 0 | 1 | 1 | 1 | 0 | ON | OFF |
| 1 | 0 | 0 | 0 | 1 | 1 | ON | OFF |
| 1 | 0 | 1 | 0 | 1 | 0 | OFF | ON |
| 1 | 1 | 0 | 0 | 0 | 1 | OFF | ON |
| 1 | 1 | 1 | 0 | 0 | 0 | OFF | ON |

CURRENT SOURCE CELL USE IN CURRENT SEGMENT TYPE D AND A CONVERTER

BACKGROUND OF THE INVENTION

1. Field of the Invention

The present invention relates to a D to A converter for converting a digital input signal into a current or voltage corresponding to the digital input signal and outputting it and, more particularly, to a current segment type D to A converter.

2. Description of the Related Art

FIG. 1 shows a conventional current segment type D to A converter. This D to A converter includes a decoder 11, current source cells 12-1 to 12-n, and a resistor R1. The decoder 11 decodes digital input signals D0, D1, D2, ..., Dm to generate control signals SD-1 to SD-n. The current source cells 12-1 to 12-n include constant current sources 12A-1 to 12A-n and switching circuits 12B-1 to 12B-n, which are ON/OFF-controlled by the control signals SD-1 to SD-n, respectively. One terminal of each of the switching circuits 12B-1 to 12B-n is connected to an output terminal 13. The resistor R1 is connected between the output terminal 13 and a power supply $V_{DD}$.

In the above arrangement, for example, when the digital signals D0, D1, D2, ..., Dm are 4 bit (m=3) signals, the number of the current source cells 12-1 to 12-n must be 15 (n=15), and the digital input signals D0, D1, D2, and D3 are decoded by the decoder 11, thereby generating control signals SD-1 to SD-15.

FIG. 2 shows a relationship between the digital input signals D0, D1, D2, and D3 and the control signals SD-1 to SD-15. In this case, the resistance of the resistor R1 is set to be 1 kΩ, the power supply $V_{DD}$ is set to be 5 V, and each of the current values I0 of the constant current sources 12A-1 to 12A-15 is set to be 100 μA. When a control signal SD-k (k=1 to 15) is set to "1" level, a switching circuit 12B-k controlled by this signal is turned on. When the control signal SD-k is set to "0" level, the switching circuit 12B-k controlled by this signal is turned off. A current Iout and a voltage Vout output from the output terminal 13 of the D to A converter are represented as follows, and an analog signal according to a digital input signal is output.

$$Iout = (2^3 D3 + 2^2 D2 + 2^1 D1 + 2^0 D0) I0$$

$$Vout = V_{DD} - R1\{(2^3 D3 + 2^2 D2 + 2^1 D1 + 2^0 D0) I0\}$$

As shown in FIG. 3, MOS transistors Tr are used in the switching circuits 12B-1 to 12B-n of the CMOS type D to A converter. Each of the MOS transistors Tr has parasitic capacitances Cs1 and Cs2 between the gate and the drain and between the gate and the source, respectively. That is, the parasitic capacitance Cs1 is present between the output terminal 13 and the gate of the MOS transistor Tr. Theoretically, as shown in FIG. 2, when the digital input signals D0, D1, D2, and D3 are changed from D0=D1=D2=D3=0 to D0=D1=D2=D3=1, according to this, all the control signals SD-1 to SD-15 are changed from "0" level to "1" level, and the all the MOS transistors Tr, which are set in an OFF state, are turned on. As a result, the output voltage Vout drops from 5 V to 3.5 V. However, when the control signals SD-1 to SD-n are changed from "0" level to "1" level due to the presence of the parasitic capacitance Cs1, as shown in FIG. 4, the output voltage Vout is temporarily boosted to 5 V or more due to coupling caused by the parasitic capacitance Cs1, thereby generating some switching noise. The level of this switching noise is increased, as the number of transistors which must be simultaneously switched is large. For this reason, when a D to A converter has a high resolution, i.e., a large number of bits, the above switching noise is disadvantageously increased.

SUMMARY OF THE INVENTION

It is, therefore, an object of the present invention to provide a current segment type D to A converter capable of suppressing switching noise and preventing distortion of an output voltage waveform. In order to achieve the object, according to the present invention, there is provided a current source cell used in a current segment type D to A converter, comprising a first switching circuit switching-controlled by a first control signal generated by decoding a digital input signal, a constant current source, connected to one terminal of the first switching circuit, for supplying a constant current, and a first transistor connected between the other terminal of the first switching circuit and a first output terminal and normally set in an ON state.

With the above arrangement, since the first transistor is arranged, a change in output voltage can be suppressed by removing the influence of parasitic capacitance included in a transistor forming the first switching circuit. Therefore, there is provided a current segment type D to A converter capable of suppressing switching noise and preventing distortion of an output voltage waveform.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a circuit diagram showing a current segment type D to A converter according to a fifth embodiment of the present invention;

DETAILED DESCRIPTION OF THE PREFERRED EMBODIMENTS

Figures 1, 2:
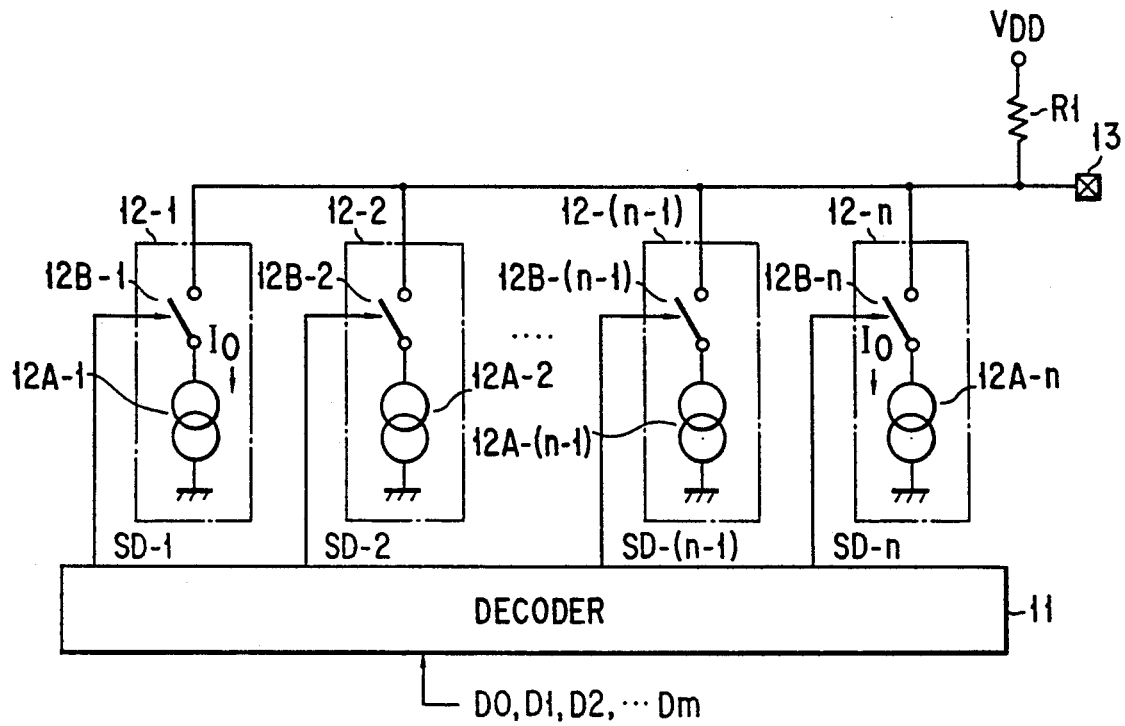
FIG. 1 is a circuit diagram showing a conventional current segment type D to A converter.
FIG. 2 is a diagram showing a relationship between digital input signals, control signals, output currents, and output voltages of the D to A converter shown in FIG. 1.
Figure 3:
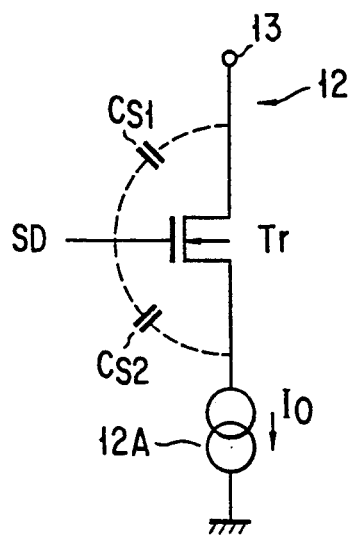
FIG. 3 is a circuit diagram showing an arrangement of a current source cell in the circuit shown in FIG. 1.
Figure 4:
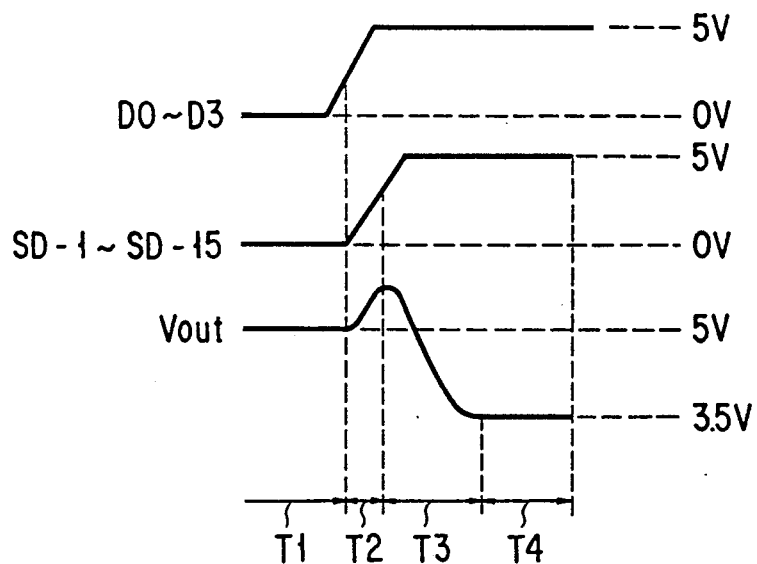
FIG. 4 is a timing chart for explaining an operation of the current source cell shown in FIG. 3.
Figure 5:
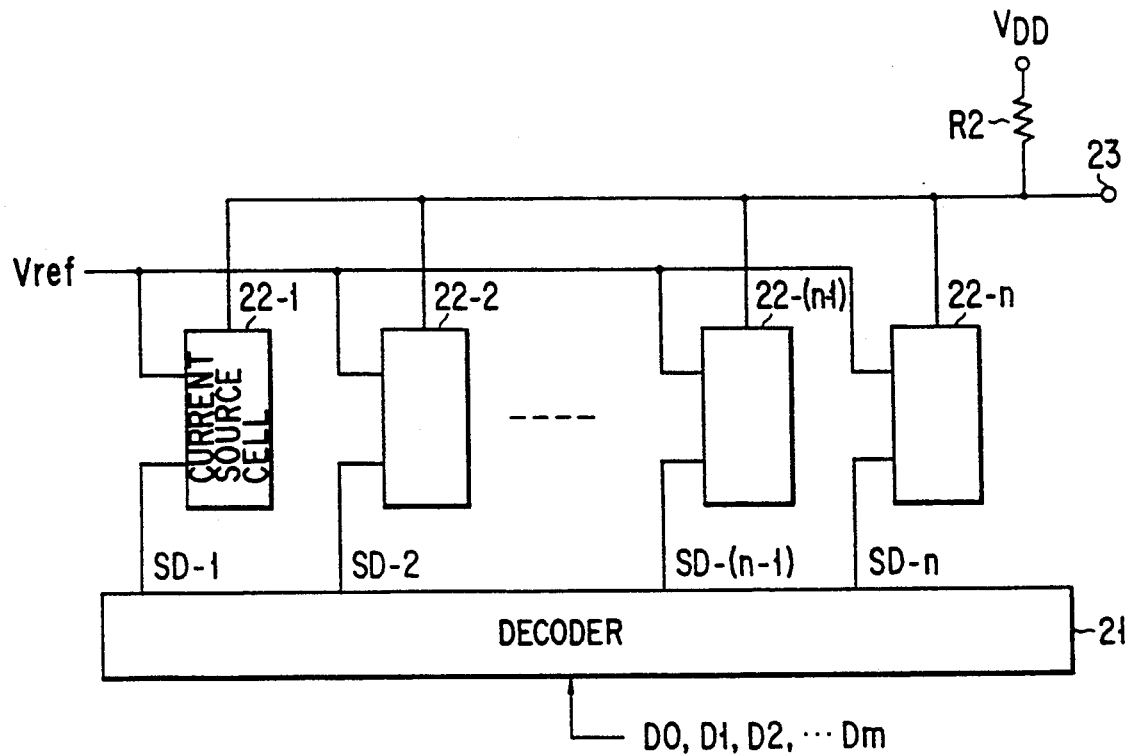
FIG. 5 is a circuit diagram showing a current segment type D to A converter according to a first embodiment of the present invention.

FIG. 5 shows a D to A converter according to a first embodiment, of the present invention. The D to A converter includes a decoder 21, current source cells 22-1 to 22-n, and a resistor R2. The decoder 21 decodes digital input signals D0, D1, D2, ..., Dm to generate control signals SD-1 to SD-n. The control signals SD-1 to SD-n and a reference voltage Vref are supplied to the current source cells 22-1 to 22-n, respectively. The output terminals of the current source cells 22-1 to 22-n are commonly connected to an output terminal 23. The resistor R2 is connected between the output terminal 23 and the power supply $V_{DD}$.

Figure 6:
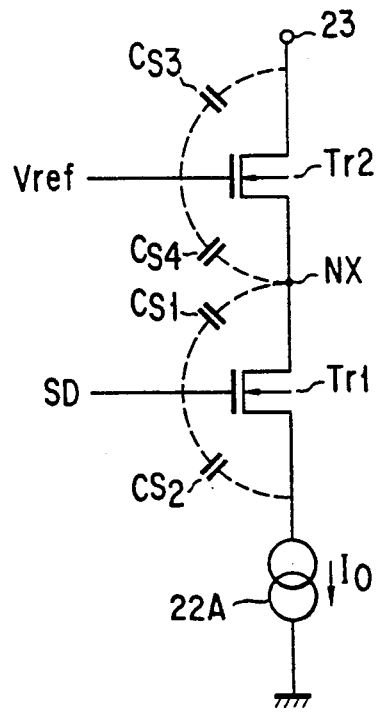
FIG. 6 is a circuit diagram showing an arrangement of a power current source cell in the circuit shown in FIG. 5.

FIG. 6 is an arrangement of each of the current source cells 22-1 to 22-n shown in FIG. 5. Each of the current source cells 22-1 to 22-n includes n-channel MOS transistors Tr1 and Tr2 and a constant current source 22A. The constant current source 22A is connected between the source of the transistor Tr1 and ground. A control signal SD is supplied to the gate of the transistor Tr1. The source of transistor Tr2 is connected to the drain of the transistor Tr1, and the drain of the transistor Tr2 is connected to the output terminal 23. The reference voltage Vref is applied to the gate of the transistor Tr2. This reference voltage Vref is set to be a voltage larger than the threshold voltage of the transistor Tr2.

A parasitic capacitance Cs1 is present between the gate and drain of the transistor Tr1, and a parasitic capacitance Cs2 is present between the gate and source of the transistor Tr1. In addition, a parasitic capacitance Cs3 is present between the gate and drain of the transistor Tr2, and a parasitic capacitance Cs4 is present between the gate and source of the transistor Tr2.

With the above arrangement, an operation performed when the control signal SD is changed from low level $(SD_L)$ to high level $(SD_H)$ will be described below with reference to FIG. 7. In a time interval T1, the potential of the control signal SD is set at low level, and the transistor Tr1 is set in an OFF state. At this time, the transistor Tr2 is in an on state. Assuming that the potential of the connection point NX between the transistors Tr1 and Tr2 is represented by $V_{NX}$, this potential is set to be $V_{NXH}$, and charges Q1 and Q4 are stored in the parasitic capacitances Cs1 and Cs4, respectively. These charges Q1 and Q4 are represented as follows:

$$Q1 = Cs1(V_{NXH} - SD_L)$$

$$Q4 = Cs4(Vref - V_{NXH})$$

In a time interval T2, when the control signal SD is changed from low level $(SD_L)$ to high level $(SD_H)$, since the charges Q1 and Q4 are kept to be stored in the parasitic capacitances Cs1 and Cs4, the potential $V_{NX}$ of the connection point NX is shifted from low level $V_{NXH}$ to high level $V_{NXHH}$. Since, in the time interval T2, the level of the control signal SD is lower than the threshold voltage of the transistor Tr1, the transistor Tr1 is turned off. Since, moreover, a potential at the connection point NX is increased to $V_{NXHH}$, a potential at the source of the transistor Tr2 is increased and thus a voltage between the gate and source of the transistor Tr2 is decreased, with the result that the transistor Tr2 is turned off. Therefore, a charge stored in the parasitic capacitance Cs3 is equal to that in the time interval T1. In addition, since the reference voltage Vref is constant, the potential of the output terminal 23 is not changed.

In a time interval T3, since the level of the control signal SD exceeds the threshold voltage of the transistor Tr1, the transistor Tr1 is turned on, the potential $V_{NXHH}$ of the connection point NX is shifted to low level $V_{NXL}$.

Thereafter, in a time interval T4, if the potential $V_{NX}$ at the connection point NX is decreased, and the voltage between the gate and source of the transistor Tr2 is increased and exceeds the threshold voltage of the transistor Tr2, the transistor Tr2 is turned on, a current starts to flow, and the potential of the output terminal 23 is started to be shifted to a desired voltage VoutL. In a time interval T5, the control signal SD, the potential $V_{NX}$ of the connection point NX, and the potential of the output terminal 23 are set in a stable state, and the charges Q1 and Q4 stored in the parasitic capacitances Cs1 and Cs4 are discharged.

Figure 7:
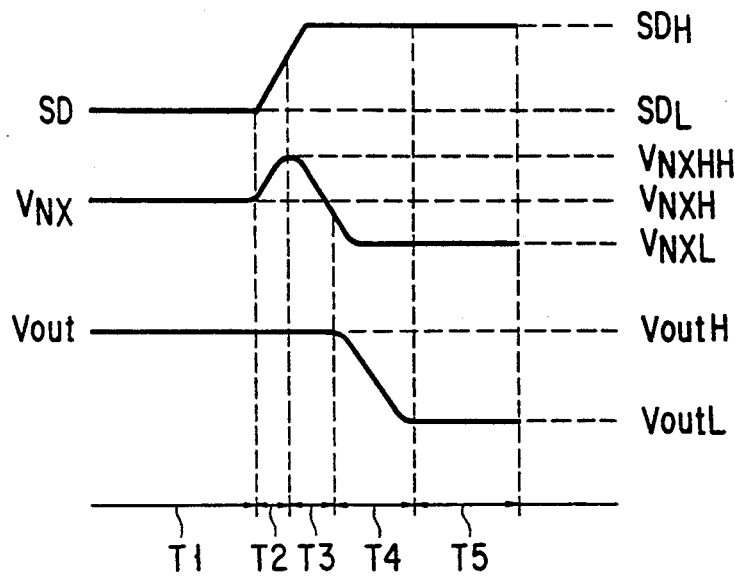
FIG. 7 is a timing chart for explaining an operation of the current source cell shown in FIG. 6.

As shown in FIG. 7, although the potential of the connection point NX is changed, the influence of the parasitic capacitance Cs1 of the transistor Tr1 is removed by arranging the transistor Tr2 to suppress a change in output voltage. Therefore, generation of switching noise and distortion of an output voltage waveform can be prevented.

Figure 8:
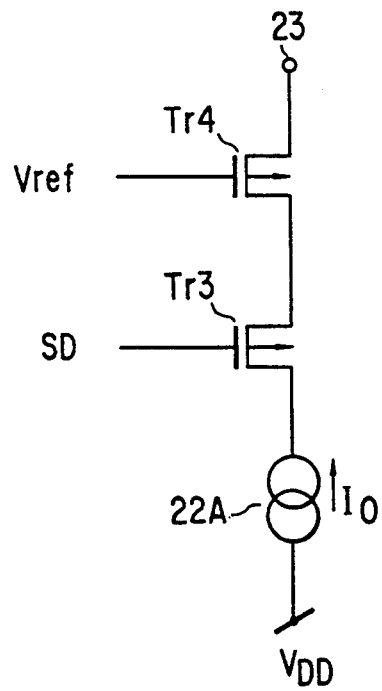
FIG. 8 is a circuit diagram showing another arrangement of a current source cell in the circuit shown in FIG. 5.

In the above embodiment, the MOS transistors Tr1 and Tr2 include n-channel transistors. However, as shown in FIG. 8, the MOS transistors Tr1 and Tr2 may include the p-channel MOS transistors Tr3 and Tr4. In this case, one terminal of a constant current source 22A is connected to the power supply $V_{DD}$.

Figure 9:
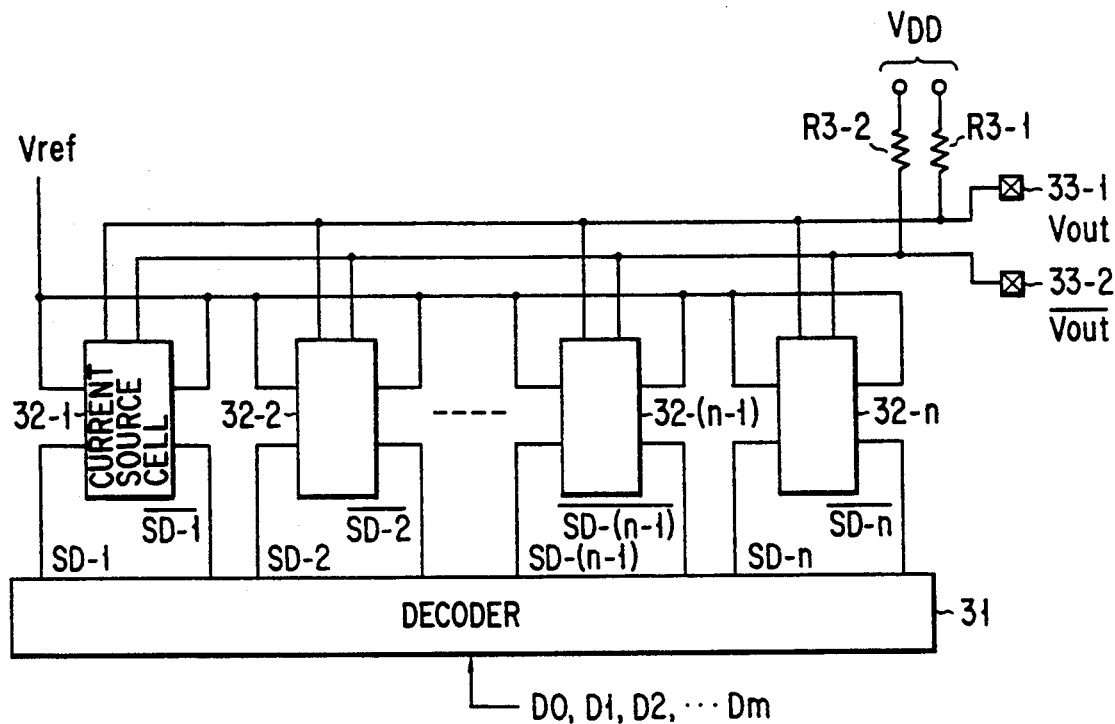
FIG. 9 is a circuit diagram showing a current segment type D to A converter according to a second embodiment of the present invention.

FIG. 9 shows a D to A converter according to a second embodiment of the present invention. The D to A converter includes a decoder 31, current source cells 32-1 to 32-n, and resistors R3-1 and R3-2. The decoder 31 decodes digital input signals D0, D1, D2, ..., Dm to generate control signals SD-1 to SD-n and SD-1 to SD-n. The control signals SD-1 to SD-n and SD-1 to SD-n and a reference voltage Vref are supplied to the current source cells 32-1 to 32-n, respectively. The first output terminals of the current source cells 32-1 to 32-n are commonly connected to a first output terminal 33-1, and the second output terminals are commonly connected to a second output terminal 33-2. The resistor R3-1 is connected between the first output terminal 33-1 and a power supply $V_{DD}$, and the resistor R3-2 is connected between the second output terminal 33-2 and the power supply $V_{DD}$.

Figure 10:
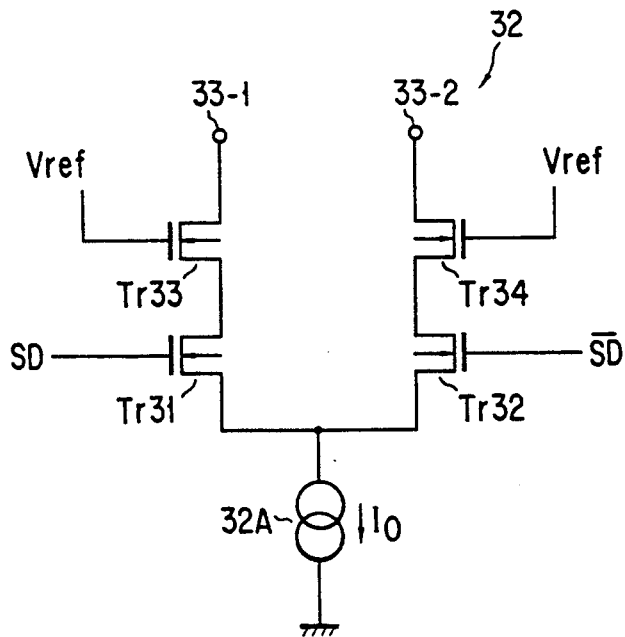
FIG. 10 is a circuit diagram showing an arrangement of a current source cell in the circuit shown in FIG. 9.

FIG. 10 shows an arrangement of each of the current source cells 32-1 to 32-n. Each of the current source cells 32-1 to 32-n includes n-channel MOS transistors Tr31, Tr32, Tr33, and Tr34 and a constant current source 32A. That is, control signals SD and $\overline{SD}$ are supplied to the gates of the transistors Tr31 and Tr32, respectively. The constant current source 32A is connected between the sources of the transistors Tr31 and Tr32 and the ground point. The source of the transistor Tr33 is connected to the drain of the transistor Tr31, and the source of the transistor Tr34 is connected to the drain of the transistor Tr32. The reference voltage Vref is connected to each of the gates of the transistors Tr33 and Tr34, and the drains thereof are connected to the output terminals 33-1 and 33-2, respectively. The reference voltage Vref is set to be a voltage higher than the threshold voltages of the transistors Tr33 and Tr34, and the transistors Tr33 and Tr34 are set in an ON state when $V_{ref}$ is applied.

With the above arrangement, since the control signals SD and $\overline{SD}$ are opposite-phase signals, any one of the transistors Tr31 and Tr32 is set in an ON state, and the other is set in an OFF state. Therefore, the constant current source 32A of each of the current source cells 32-1 to 32-n is connected to any one of the output terminals 33-1 or 33-2.

In the second embodiment, since the current source cells are obtained such that the current source cells of the first embodiment have a differential input arrangement, the same effect as described in the first embodiment can be obtained. In addition, in the second embodiment, since a current I0 is always supplied to the constant current source 32A, though the control signal SD and $\overline{SD}$ are present, output voltages Vout and $\overline{Vout}$ can be immediately output in response to the switching operation of the transistors Tr31 and Tr32. Therefore, the circuit of the second embodiment can be operated at a speed higher than that of the circuits shown in FIGS. 6 and 8.

Figure 11:
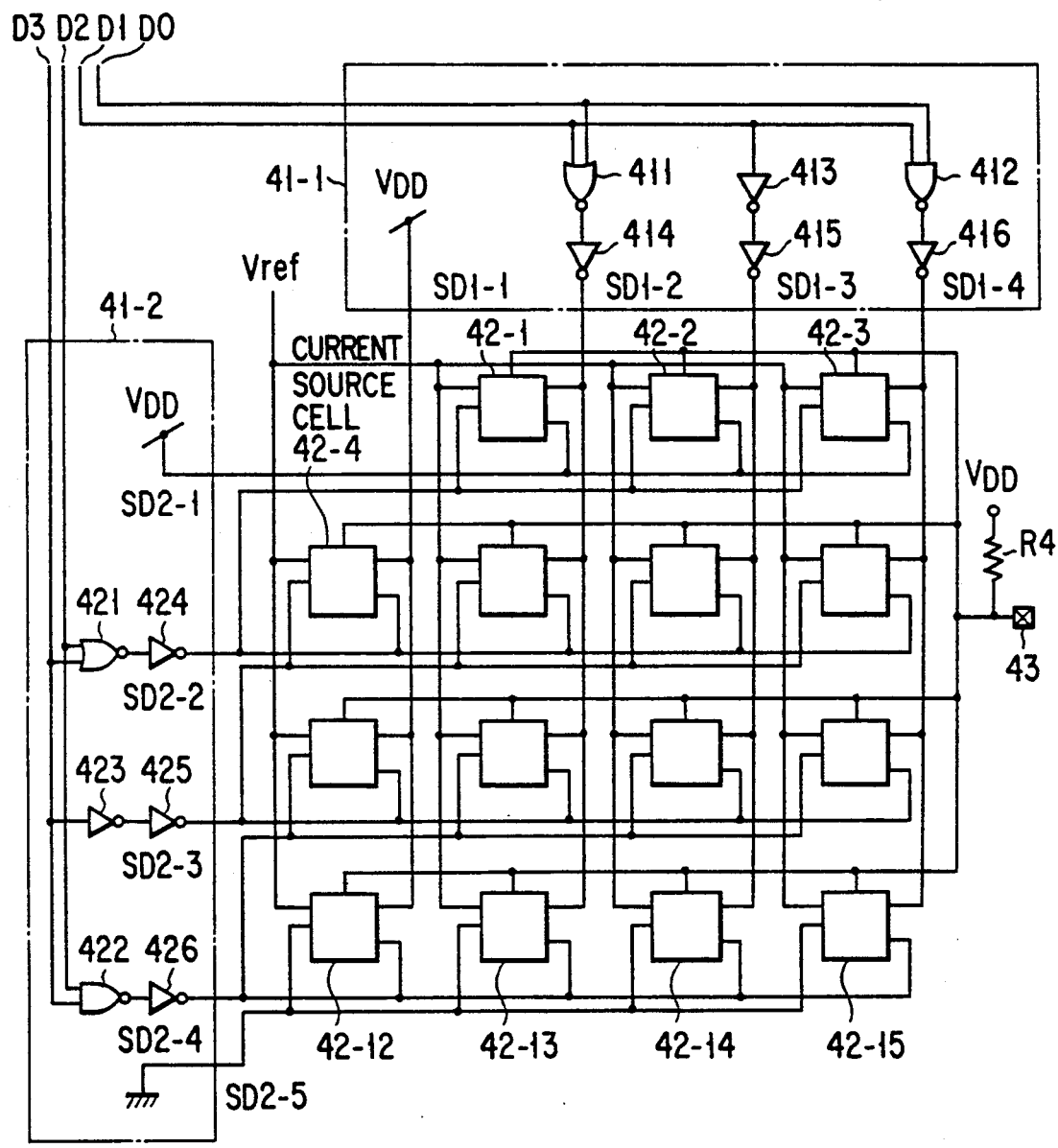
FIG. 11 is a circuit diagram showing a current segment type D to A converter according to a third embodiment of the present invention.

FIG. 11 shows a D to A converter according to a third embodiment of the present invention. The D to A converter includes decoders 41-1 and 41-2, current source cells 42-1 to 42-15 arranged in a matrix form, and a resistor R4. The decoder 41-1 includes a NOR gate 411, a NAND gate 412, and inverters 413 to 416. This decoder 41-1 decodes the lower two bits D0 and D1 of input signals D0, D1, D2, and D3 to output control signals SD1-1 to SD1-4. The decoder 41-2 includes a NOR gate 421, a NAND gate 422, and inverters 423 to 426. The decoder 41-2 decodes the upper two bits D2 and D3 of the digital input signals D0, D1, D2, and D3 to output control signals SD2-1 to SD2-5. The decoders 41-2, and 41-2 respectively, output control signals corresponding to the digital input signals. The current source cells 42-1 to 42-15 are selected by the control signals. A reference voltage Vref is supplied to each of the current source cells 42-1 to 42-15, and the output terminals of the current source cells 42-1 to 42-15 are connected to an output terminal 43. The resistor R4 is connected between the output terminal 43 and a power supply $V_{DD}$.

With the above arrangement, all the digital output signals D0, D1, D2, and D3 are set at "0" level, the current source cells 42-1 to 42-15 are not selected. When the digital input signal D0 is set at "1" level and the signal D1, D2, and D3 are set at "0" level, the current source cell 42-1 is selected. When the digital input signal D1 is set at "1" level and the signals D0, D2, and D3 are set at "0" level, the current source cells 42-1 and 42-2 are selected. When the digital input signals D0 and D1 are set at "1" level and the signals D2 and D3 are set at "0" level, the current source cells 42-1 to 42-3 are selected. Similarly, as the digital input signals D0, D1, D2, and D3 are sequentially increased, the current source cells 42-1 to 42-4, 42-1 to 42-5, ..., 42-1 to 42-15 are sequentially selected, and the output terminal 43 outputs a voltage and a current corresponding to the digital input signals.

Figure 12:
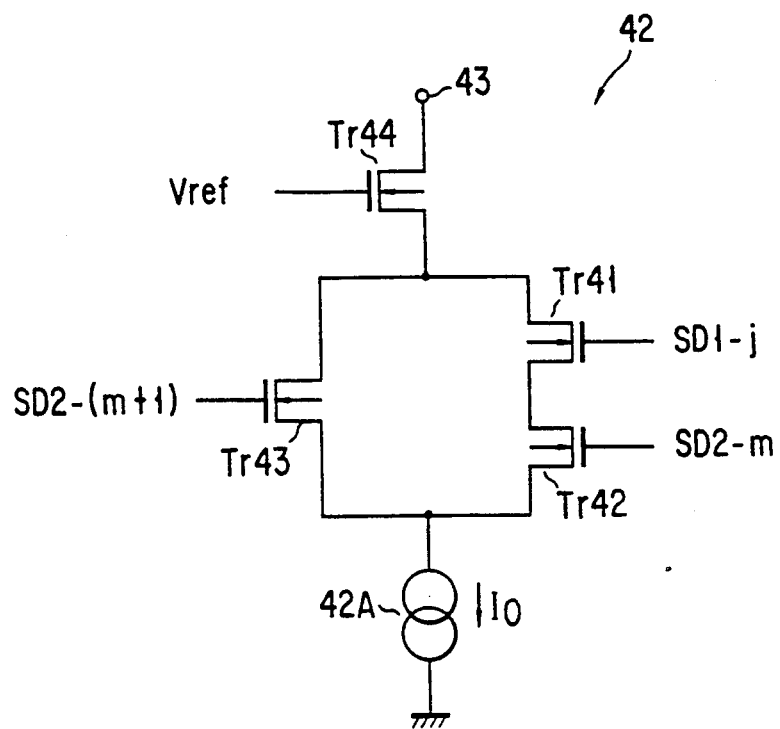
FIG. 12 is a circuit diagram showing an arrangement of a current source cell in the circuit shown in FIG. 11.

FIG. 12 shows an arrangement of each of the current source cells 42-1 to 42-15 shown in FIG. 11. Each of the current source cells 42-1 to 42-15 includes n-channel MOS transistors Tr41 to Tr44 and a constant current source 42a. The current source cells 42-1 to 42-15 can be selected in accordance with control signals SD1-1 to SD1-4 and SD2-1 to SD2-5 output from the decoders 41-1 and 41-2. That is, the source of the transistor Tr41 is connected to the drain of the transistor Tr42, and the transistor Tr43 is parallelly connected to the series circuit formed by the transistors Tr41 and Tr42. A control signal SD1-j (j=1 to 4) output from the decoder 41-1 is supplied to the gate of the transistor Tr41, and control signals SD2-m (m=1 to 4) and SD2-(m+1) output from the decoder 41-2 are supplied to the gates of the transistors Tr42 and Tr43, respectively. The constant current source 42A is connected between the sources of the transistors Tr42 and Tr43 and the ground point. The source of the transistor Tr44 is connected to the drains of the transistors Tr41 and Tr43. The reference voltage Vref is supplied to the gate of the transistor Tr44, and the drain of the transistor Tr44 is connected to the output terminal 43. The reference voltage Vref is set to be a voltage sufficiently higher than the threshold voltage of the transistor Tr44, and the transistor Tr44 is set in an ON state when $V_{ref}$ is applied.

With the above arrangement, as in the first and second embodiments, the transistor Tr44 can prevent noise and distortion of an output voltage waveform which occur in the switching operation of the transistors Tr41, Tr42, and Tr43. In addition, when the current source cells are arranged in a matrix form, a current source cell can be selected in accordance with control signals output from the decoders 41-1 and 41-2.

Figure 13:
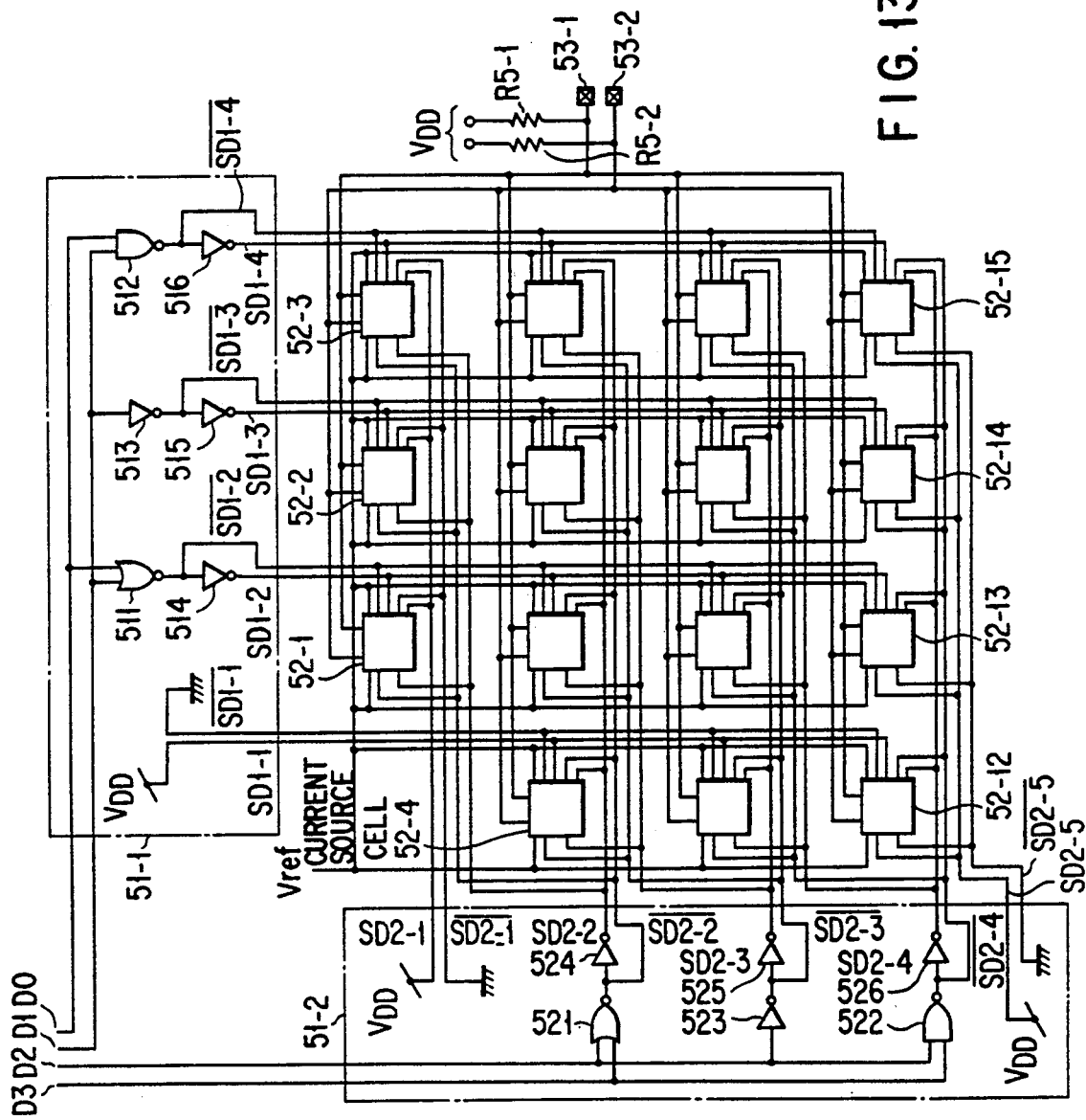
FIG. 13 is a circuit diagram showing a current segment type D to A converter according to a fourth embodiment of the present invention.

FIG. 13 shows a D to A converter according to a fourth embodiment of the present invention. The D to A converter includes decoders 51-1 and 51-2, current source cells 52-1 to 52-15 arranged in a matrix form, and resistors R5-1 and R5-2. The decoder 51-1 includes a NOR gate 511, a NAND gate 512, and inverters 513 to 516. The decoder 51-1 decodes the lower two bits D0 and D1 of digital input signals D0, D1, D2, and D3 to output control signals SD1-1 to SD1-4 and SD1-1 to SD1-4. The decoder 51-2 includes a NOR gate 521, a NAND gate 522, and inverters 523 to 526. The decoder 51-2 decodes the upper two bits D2 and D3 of the digital input signals D0, D1, D2, and D3 to output control signal SD2-1 to SD2-5 and SD2-1 to SD2-5. The decoders 51-1 and 51-2, respectively, output control signals corresponding to the digital input signals. The current source cells 52-1 to 52-15 are selected by the control signals. A reference voltage Vref is applied to each of the current source cells 52-1 to 52-15. The first output terminals of the current source cells 52-1 to 52-15 are connected to an output terminal 53-1, and the second output terminals are connected to output terminal 53-2. The resistor R5-1 is connected between the first output terminal 53-1 and a power supply $V_{DD}$, and the resistor R5-2 is connected between the second output terminal 53-2 and the power supply $V_{DD}$.

With the above arrangement, when all the digital input outputs D0, D1, D2, and D3 are set at "0" level, the current supply cells 52-1 to 52-15 are not selected in respect of output terminal 53-1. When the digital input signal D0 is set at "1" level and the signal D1, D2, and D3 are set at "0" level, the current source cell 52-1 is selected in respect of output terminal 53-1. When the digital input signal D1 is set at "1" level and the signals D0, D2, and D3 are set at "0" level, the current source cells 52-1 and 52-2 are selected in respect of output terminal 53-1. When the digital input signals D0 and D1 are set at "1" level and the signals D2 and D3 are set at "0" level, the current source cells 52-1 to 52-3 are selected in respect of output terminal 53-1. Similarly, as the digital input signals D0, D1, D2, and D3 are sequentially increased, the current source cells 52-1 to 52-4, 52-1 to 52-5, . . . , 52-1 to 52-15 are sequentially selected, and the output terminals 52-1 and 52-2 output a voltage and a current corresponding to the digital input signals.

Figure 14:
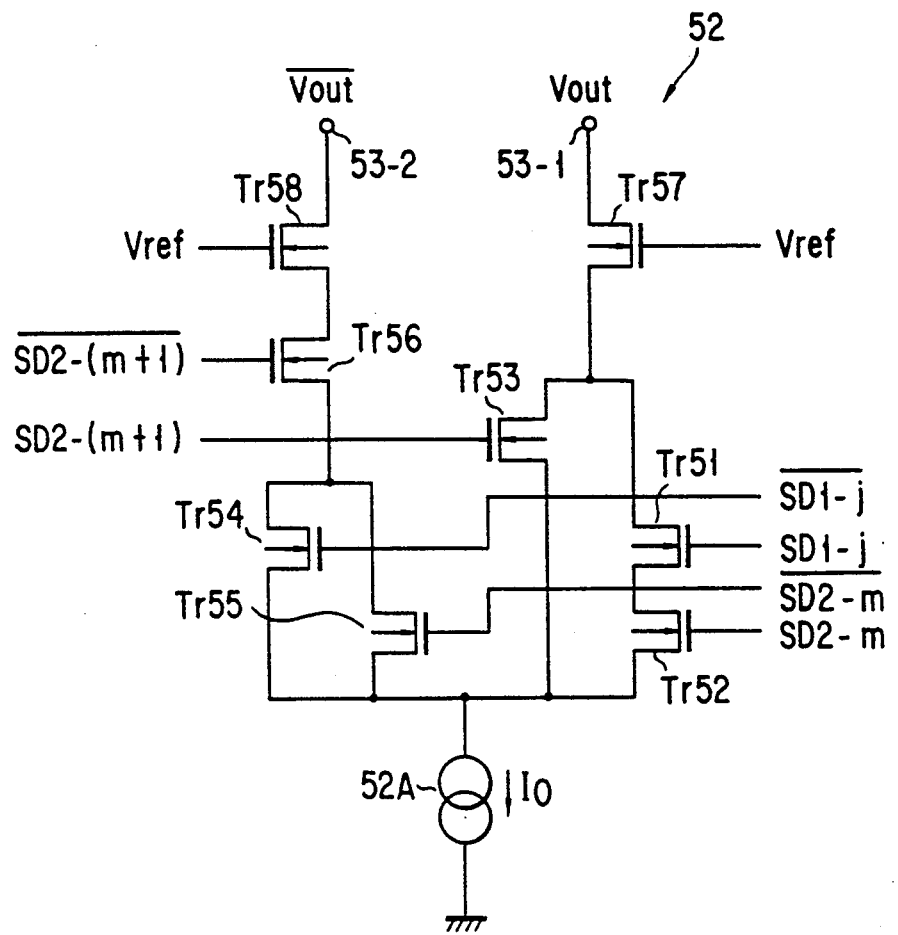
FIG. 14 is a circuit diagram showing an arrangement of a current source cell in the circuit shown in FIG. 13.

FIG. 14 shows an arrangement of each of the current source cells 52-1 to 52-15 shown in FIG. 13. The current source cells 52-1 to 52-15 also have the characteristic feature of the current source cells shown in FIGS. 10 and 12. That is, each of the current source cells 52-1 to 52-15 includes n-channel MOS transistors Tr51 to Tr58 and a constant current source 52A, and the current source cells 52-1 to 52-15 can be selected in accordance with control signals output from the decoders 51-1 and 51-2. The source of the transistor Tr51 is connected to the drain of the transistor Tr52, and the transistor Tr53 is parallelly connected to a series circuit formed by the transistors Tr51 and Tr52. The constant current source 52A is connected between the transistors Tr52 and Tr53 and the ground point. A control signal SD1-j (j=1 to 4) output from the decoder 51-1 is supplied to the gate of the transistor Tr51, and control signals SD2-m (m=1 to 4) and SD2-(m+1) output from the decoder 51-2 are supplied to the gates of the transistors Tr52 and Tr53, respectively.

The transistors Tr54 and Tr55 are parallelly connected to each other. The sources of the transistors Tr54 and Tr55 are connected to the constant current source 52A, and the drains of the transistors Tr54 and Tr55 are connected to the source of the transistor Tr56. A control signal SD1-j output from the decoder 51-1 is supplied to the gate of the transistor Tr54, and control signals SD2-m and SD2-(m+1) output from the decoder 51-2 are supplied to the gates of the transistors Tr55 and Tr56, respectively.

The source of the transistor Tr57 is connected to the drains of the transistors Tr51 and Tr53. The reference voltage Vref is supplied to the gate of the transistor Tr57, and the drain thereof is connected to the first output terminal 53-1. The source of the transistor Tr58 is connected to the drain of the transistor Tr56. The reference voltage Vref is applied to the gate of the transistor Tr58, and the drain thereof is connected to the output terminal 53-2. The reference voltage Vref is set to be a voltage sufficiently higher than the threshold voltages of the transistors Tr57 and Tr58, and the transistors Tr57 and Tr58 are set in an ON state when $V_{ref}$ is applied.

With the above arrangement, the transistors Tr57 and Tr58 can prevent power supply noise and distortion of an output voltage waveform which occur in the switching operation of the transistors Tr51 to Tr56. When the current source cells are arranged in a matrix form, a current source cell can be selected in accordance with control signals output from the decoders 51-1 and 51-2. In addition, since a current is normally supplied to the constant current source 52A, an output voltage Vout or $\overline{Vout}$ can be immediately output in response to the switching operation of the transistors Tr51 to Tr56. For this reason, a high-speed operation can be performed.

In FIGS. 10, 12, and 14, the current source cells include n-channel MOS transistors. However, as in FIG. 8, the current source cells also may include p-channel MOS transistors.

FIG. 15 shows a D to A converter according to a fifth embodiment of the present invention. In this embodiment, a segment current type D to A converter is used for high-speed processing of, e.g., a video signal. In this D to A converter, whether a plurality of current source cells arranged in a matrix form on a semiconductor chip can be output or not is switching-controlled by a plurality of row selection signals and a plurality of column selection signals, thereby outputting the sum of the outputs. A simplified 4-bit D to A converter is shown in FIG. 15. The upper two bits (D2 and D3) of four one-bit digital input signals D0, D1, D2, and D3 are supplied to an X decoder 61, and the lower two bits (D0 and D1) are supplied to a Y decoder 62. The X decoder 61 includes a NAND gate 611, an inverter 612, and a NOR gate 613 and decodes the digital input signals D2 and D3 to generate decoded outputs X1 to X3. A latch circuit 63 latches an output from the X decoder 61 to output segment selecting signals X1 to X3 at a predetermined timing. The Y decoder 62 includes a NAND gate 621, an inverter 622, and a NOR gate 623 and decodes the digital input signals D0 and D1 of the lower two bits to generate decoded outputs Y1 to Y3. A latch circuit 64 latches an output from the Y decoder 62 to output segment selecting signals Y1 to Y3 at a predetermined timing. Current source cells SEG1 to SEG15 are arranged in a matrix form on a single semiconductor chip. A current output terminal 65 is connected to the output terminals of the current source cells SEG1 to SEG15 to output the sum of current outputs of the current source cells SEG1 to SEG15.

Circuits (the X decoder 61, the Y decoder 62, and the latch circuits 63 and 64) for inputting the row selection control signals and the column selection control signals output complementary signals for controlling selection of a given row, complementary signals for controlling selection of a row adjacent to the given column, and complementary signals for controlling selection of a column to the current source cells SEG1 to SEG15. In this embodiment, the output signals X1 to X3 from the latch circuit 62 are inverted by inverters 66 to 68 to generate complementary signals $\overline{X1}$ to $\overline{X3}$ of the signals X1 to X3, and the output signals Y1 to Y3 from the latch circuit 64 are inverted by inverters 69 to 71 to generate complementary signals $\overline{Y1}$ to $\overline{Y3}$. Complementary segment selection signals Xi and $\overline{Xi}$ for controlling selection of a given row, complementary segment selection signals $Xi+1$ and $Xi+1$ for controlling selection of a row adjacent to the given row, and complementary segment selection signals $Yi$ and $\overline{Yi}$ for controlling selection of a column are supplied to the current source cells SEG5 to SEG7 and SEG9 to SEG11, respectively. In addition, signals of fixed levels "1" and "0" are supplied to the current source cells SEG1 to SEG4 as complementary signals for controlling selection of a given row, and signals of fixed levels "1" and "0" are supplied to the current source cells SEG13 to SEG15 as complementary signals for controlling selection of a row adjacent to the given row. Signals of fixed levels "1" and "0" are supplied to the current source cells SEG4, SEG8, and SEG12 as complementary signals for controlling selection of a column.

Figures 16, 17:
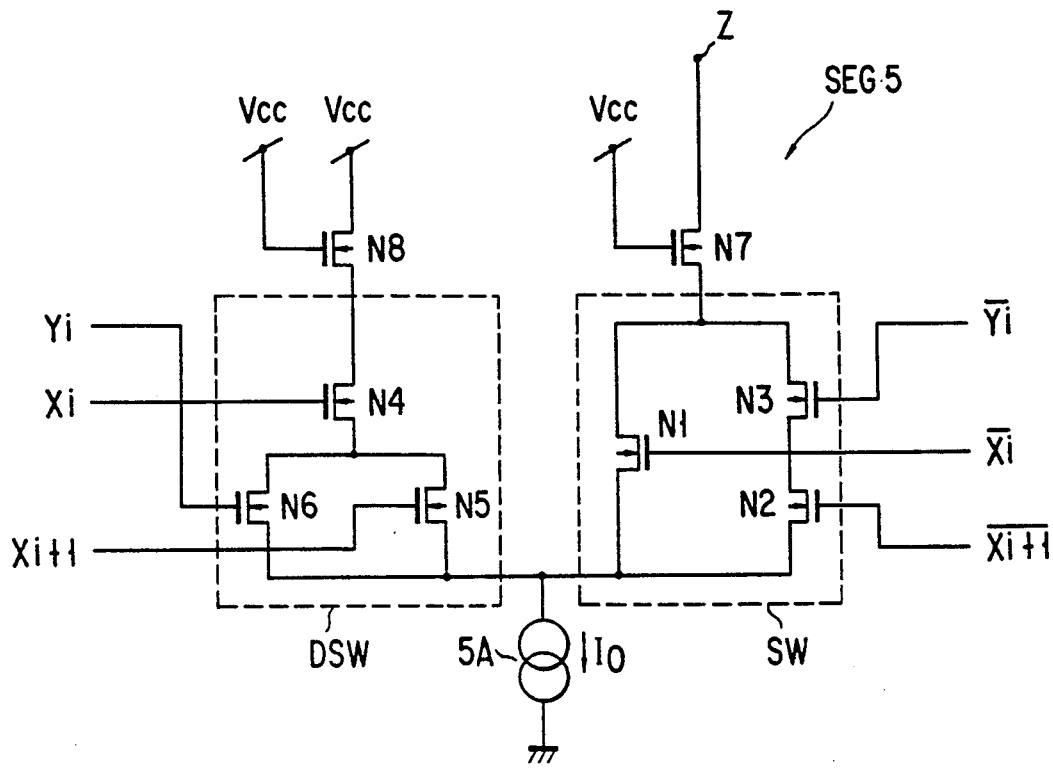
FIG. 16 is a circuit diagram showing an arrangement of a current source cell in the circuit shown in FIG. 15.
FIG. 17 is a diagram for explaining an operation of the current source cell shown in FIG. 16.

FIG. 16 shows a circuit arrangement of one (in this case, the SEG5) representatively selected from the current source cell SEG1 to SEG15 in the circuit shown in FIG. 15. This current source cell SEG5 includes a reference current source 5A for supplying a constant current $I_0$ serving as a reference, an output switching circuit SW, a dummy output switching circuit DSW, and n-channel MOS transistors N7 and N8. The output switching circuit SW and the dummy output switching circuit DSW are commonly connected to the reference current source 5A and receive complementary segment selection signals $Xi$ and $\overline{Xi}$ for controlling selection of a given row, complementary segment selection signals $Xi+1$ and $Xi+1$ for controlling selection of a row adjacent to the given row, and complementary segment selection signals $Yi$ and $\overline{Yi}$ for controlling selection of a column. The switching signals SW and DSW are controlled such that any one circuit of the switching circuits SW and DSW is set in an ON state. The current path of the transistor N7 is connected between the output switching circuit SW and a segment current output node Z, and the gate of the transistor N7 is connected to a power supply $V_{cc}$, such that the transistor N7 is normally set in an ON state. The current path of the transistor N8 is connected between the dummy output switching circuit DSW and the power supply $V_{cc}$ (or a dummy output node), and the gate of the transistor N8 is connected to the power supply $V_{cc}$, such that the transistor N8 is set in an ON state when $V_{cc}$ is applied.

The output switching circuit SW includes n-channel MOS transistors N1, N2, and N3. One terminal the current path of the transistor N1 is connected to the current input node of the reference current source 5A, the other terminal is connected to one terminal of the current path of the transistor N7, and the segment selection signal $\overline{Xi}$ is supplied to the gate of the transistor N1. The current paths of the transistors N2 and N3 are connected in series, one terminal of the connected current paths is connected to the current input node of the reference current source 5A, and the other terminal is connected to one terminal of the current path of the transistor N7. The segment selection signal $Xi+1$ is supplied to the gate of the transistor N2, and the segment selection signal $\overline{Yi}$ is supplied to the gate of the transistor N3.

The dummy output switching circuit DSW includes n-channel MOS transistors N4, N5, and N6. One terminal of the current path of the transistor N4 is connected to one terminal of the current path of the transistor N8, and the segment selection signal $Xi$ is supplied to the gate of the transistor N4. One terminal of the current path of the transistor N5 is connected to the other terminal of the current path of the transistor N4, and the other terminal of the current path of the transistor N5 is connected to the current input node of the reference current source 5A. One terminal of the current path of the transistor N6 is connected to the other terminal of the current path of the transistor N4, and the other terminal of the current path of the transistor N6 is connected to the current input node of the reference current source 5A. The segment selection signal $Xi+1$ is supplied to the gate of the transistor N5, and the segment selection signal $Yi$ is supplied to the gate of the transistor N6.

An operation of the current source cell shown in FIG. 16 is performed in accordance with the truth table shown in FIG. 17.

With the above arrangement, each of the output switching circuit SW and the dummy output switch circuit DSW, which are controlled such that any one of the circuits is set in an ON state on the basis of combination of signals from selection signal output circuits, includes three MOS transistors having a same polarity. For this reason, the number of elements forming the current source cell is smaller than that of a current source cell using a selection logic gate having a CMOS arrangement, an output switching transistor, and a dummy output switching transistor. In addition, since isolation which must be performed in a CMOS circuit arrangement is not required, the pattern size is half as large. Therefore, when the number of current source cells is increased, the effect of decreasing the chip size of a D to A converter becomes noticeable.

Figure 18:
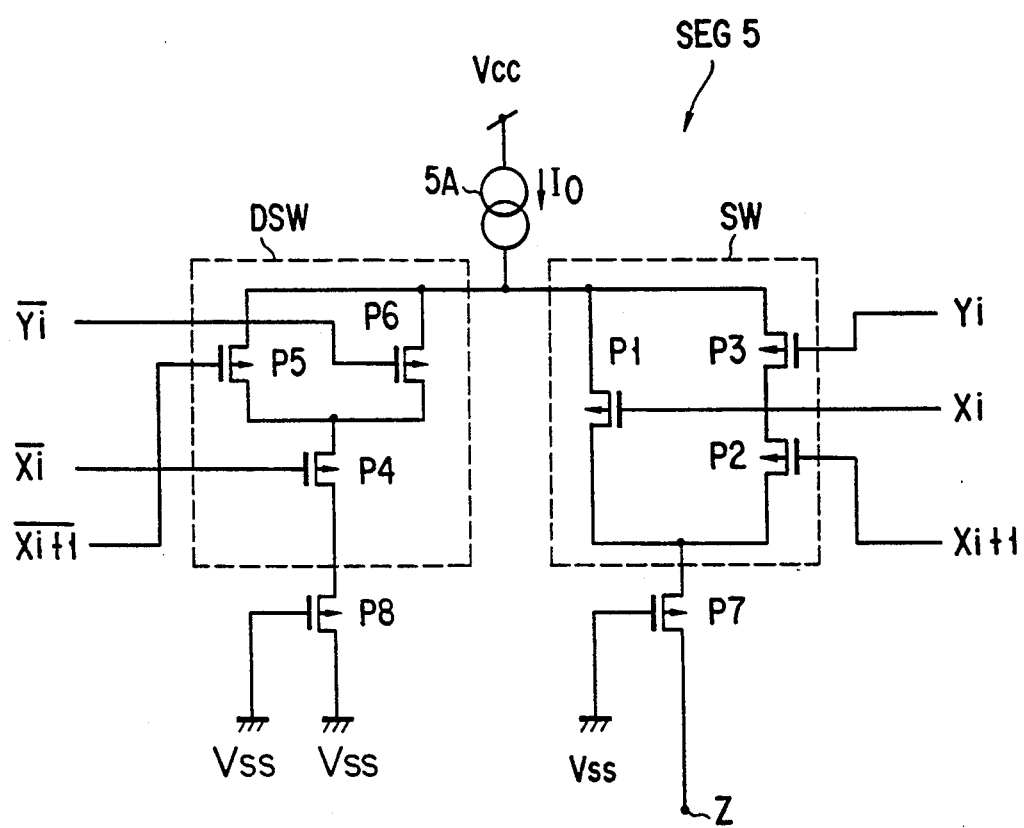
FIG. 18 is a circuit diagram showing another arrangement of the current source cell in the circuit shown in FIG. 15.

FIG. 18 shows another arrangement of the current source cell in the segment current type D to A converter shown in FIG. 15. In this arrangement, p-channel MOS transistors P1 to P8 are used in place of the n-channel MOS transistors N1 to N8. That is, a current source cell SEG5 includes a reference current source 5A for supplying a constant current $I_0$ serving as a reference, an output switching circuit SW, a dummy output switching circuit DSW, and the p-channel MOS transistors P7 and P8. The output switching circuit SW and the dummy output switching circuit DSW are commonly connected to the reference current source 5A and receive complementary segment selection signals $Xi$ and $\overline{Xi}$ for controlling selection of a given row, complementary segment selection signals $Xi+1$ and $Xi+1$ for controlling selection of a row adjacent to the given row, and complementary segment selection signals $Yi$ and $\overline{Yi}$ for controlling selection of a column. The output switching circuit SW and the dummy output switching circuit DSW are controlled on the basis of combination of these signals such that any one of these circuits is turned on. The reference current source 5A is connected to a power supply $V_{cc}$. The current path of the transistor P7 is connected between the output switching circuit SW and a segment current output node Z, and the gate of the transistor P7 is connected to a connection point $V_{ss}$ to be set in an ON state when $V_{ss}$ is applied. The current path of the transistor P8 is connected between the dummy output switching circuit DSW and the connection point $V_{ss}$ (or a dummy output node), and the gate of the transistor P8 is connected to the connection point $V_{ss}$ to be set in an ON state when $V_{ss}$ is applied.

The output switching circuit SW includes p-channel MOS transistors P1, P2 and P3. One terminal of the current path of the transistor P1 is connected to the current output node of the reference current source 5A, the other terminal is connected to one terminal of the current path of the transistor P7, and the gate of the transistor P1 receives the segment selection signal Xi. The current paths of the transistors P2 and P3 are connected to each other in series. One terminal of the series-connected current paths is connected to the current output node of the reference current source 5A, and the other terminal is connected to one terminal of the current path of the transistor P7. The segment selection signal Xi+1 is supplied to the gate of the transistor P2, and the segment selection signal Yi is supplied to the gate of the transistor P3.

The dummy output switching circuit DSW includes p-channel MOS transistors P4, P5, and P6. One terminal of the current path of the transistor P4 is connected to one terminal of the current path of the transistor P8, and the segment selection signal $\overline{Xi}$ is supplied to the gate of the transistor P4. One terminal of the current path of the transistor P5 is connected to other terminal of the current path of the transistor P4, and the other terminal of the current path of the transistor P5 is connected to the current output node of the reference current source 5A. One terminal of the current path of the transistor P6 is connected to the other terminal of the current path of the transistor P4, and the other terminal of the current path of the transistor P6 is connected to the current output node of the reference current source 5A. The segment selection signal Xi+1 is supplied to the gate of the transistor P5, and the segment selection signal $\overline{Yi}$ is supplied to the gate of the transistor P6.

A basic operation of the current source cell shown in FIG. 18 is the same as that of the circuit shown in FIG. 15. In the segment current source of FIG. 18, the same effect as in the circuit of FIG. 15 can be obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A current source cell used in a current segment type D to A converter, comprising:
   a first transistor having a current path one terminal of which is connected to an output terminal and having a gate to which a voltage higher than a threshold voltage of said first transistor is applied;
   a second transistor having a current path one terminal of which is connected to another terminal of the current path of said first transistor and having a gate supplied with a first control signal generated by decoding a digital input signal;
   a third transistor having a current path one terminal of which is connected to another terminal of the current path of said second transistor and having a gate supplied with a second control signal generated by decoding a digital input signal;
   a fourth transistor having a current path one terminal of which is connected to another terminal of the current path of said first transistor and having a gate supplied with a third control signal generated by decoding a digital input signal; and
   constant current means connected to another terminal of the current path of said third transistor and another terminal of the current path of said fourth transistor for causing a constant current to flow.

2. A converter according to claim 1, wherein said constant current means includes a constant current source.

3. A current source cell used in a current segment type D to A converter, comprising:
   a first transistor having a current path one terminal of which is connected to a first output terminal and having a gate to which a voltage higher than a threshold voltage of said first transistor is applied;
   a second transistor having a current path one terminal of which is connected to a second output terminal and having a gate to which a voltage higher than a threshold voltage of said second transistor is applied;
   a third transistor having a current path one terminal of which is connected to another terminal of the current path of said first transistor and having a gate supplied with a first control signal generated by decoding a digital input signal;
   a fourth transistor having a current path one terminal of which is connected to another terminal of the current path of said third transistor and having a gate supplied with a second control signal generated by decoding the digital input signal;
   a fifth transistor having a current path one terminal of which is connected to the other terminal of the current path of said first transistor and having a gate supplied with a third control signal generated by decoding the digital input signal;
   a sixth transistor having a current path one terminal of which is connected to another terminal of the current path of said second transistor and having a gate supplied with an inverted signal of the third control signal;
   a seventh transistor having a current path one terminal of which is connected to another terminal of the current path of said sixth transistor and having a gate supplied with an inverted signal of the second control signal;
   an eighth transistor having a current path one terminal of which is connected to the other terminal of the current path of said sixth transistor and having a gate supplied with an inverted signal of the first control signal; and
   constant current means connected to another terminal of the current path of said fourth transistor, another terminal of the current path of said fifth transistor, another terminal of the current path of said seventh transistor, and another terminal of the current path of said eighth transistor, for supplying a constant current.

4. A converter according to claim 3, wherein said constant current means includes a constant current source.

5. A current segment type D to A converter, comprising:
   current source cells arranged in a matrix form and each having an output switching circuit and a dummy output switching circuit formed by MOS transistors having a same polarity;
   each of said current source cells further including:
      a first n-channel MOS transistor having a current path connected between the output switching circuit and an output node and having a gate to which a voltage higher than a threshold voltage of said first n-channel MOS transistor is applied,
      a second n-channel MOS transistor having a current path one terminal of which is connected to the dummy output switching circuit and another terminal of which is connected to one of a node to which a constant voltage is applied and a dummy output node, and having a gate to which a voltage higher than a threshold voltage of said second n-channel MOS transistor is applied, a reference current source connected to the output switching circuit and the dummy output switching circuit, for supplying a constant reference current, and selection signal output means for supplying, to said current source cell, complementary first and second segment selection signals for controlling selection of a given row, complementary third and fourth segment selection signals for controlling selection of a row adjacent to the given row, and complementary fifth and sixth segment selection signals for controlling selection of a column, wherein said output switching circuit includes a third n-channel MOS transistor having a current path one terminal of which is connected to one terminal of the current path of said first MOS transistor and another terminal of which is connected to a current input node of said reference current source and having a gate supplied with the first segment selection signal, a fourth n-channel MOS transistor having a current path one terminal of which is connected to the current input node of said reference current source and having a gate supplied with the third segment selection signal, and a fifth n-channel MOS transistor having a current path connected between another terminal of the current path of said fourth MOS transistor and the one terminal of the current path of said first MOS transistor and having a gate supplied with the fifth segment selection signal; and wherein said dummy output switching circuit includes a sixth n-channel MOS transistor having a current path one terminal of which is connected to the one terminal of the current path of said second MOS transistor and having a gate supplied with the second segment selection signal which is an inverted signal of the first segment selection signal, a seventh n-channel MOS transistor having a current path connected between another terminal of the current path of said sixth MOS transistor and the current input node of said reference current source and having a gate supplied with the fourth segment selection signal which is an inverted signal of the third segment selection signal, and an eighth n-channel MOS transistor having a current path connected between the other terminal of the current path of said sixth MOS transistor and the current input node of said reference current source and having a gate supplied with the sixth segment selection signal which is an inverted signal of the fifth segment selection signal.

6. A converter according to claim 5, wherein said selection signal output means supplies to ones of said plurality of current source cells fixed-level signals serving as complementary signals for controlling selection of a given row and a row adjacent to the given row, and wherein said selection signal output means supplies to others of said plurality of current source cells fixed-level signals serving as complementary signals for controlling selection of a column, and wherein said selection signal output means supplies a given signal obtained by decoding a digital input signal and a complementary signal complementary to the given signal to remaining current source cells.

7. A current segment type D to A converter, comprising:

current source cells arranged in a matrix form and each having an output switching circuit and a dummy output switching circuit formed by MOS transistors having a same polarity;

each of said current source cells further including:

a first p-channel MOS transistor having a current path connected between the output switching circuit and an output node and having a gate to which a voltage lower than a threshold voltage of said first p-channel MOS transistor is applied, a second p-channel MOS transistor having a current path one terminal of which is connected to the dummy output switching circuit and another terminal of which is connected to one of a node to which a constant voltage is applied and a dummy output node, and having a gate to which a voltage lower than a threshold voltage of said second p-channel MOS transistor is applied, a reference current source for supplying a constant current to the output switching circuit and the dummy output switching circuit, and selection signal output means for supplying, to said current source cell, complementary first and second segment selection signals for controlling selection of a given row, complementary third and fourth segment selection signals for controlling selection of a row adjacent to the given row, and complementary fifth and sixth segment selection signals for controlling selection of a column, wherein said output switching circuit includes a third p-channel MOS transistor having a current path one terminal of which is connected to one terminal of the current path of said first MOS transistor and another terminal of which is connected to a current output node of said reference current source, and having a gate supplied with the first segment selection signal, a fourth p-channel MOS transistor having a current path one terminal of which is connected to the one terminal of the current path of said first MOS transistor and having a gate supplied with the third segment selection signal, and a fifth p-channel MOS transistor having a current path connected between another terminal of the current path of said fourth MOS transistor and the current output node of said reference current source and having a gate supplied with the fifth segment selection signal; and wherein said dummy output switching circuit includes a sixth p-channel MOS transistor having a current path one terminal of which is connected to the one terminal of the current path of said second MOS transistor and having a gate supplied with the second segment selection signal which is an inverted signal of the first segment selection signal, a seventh p-channel MOS transistor having a current path connected between another terminal of the current path of said sixth MOS transistor and the current output node of said reference current source and having a gate supplied with the fourth segment selection signal which is an inverted signal of the third segment selection signal, and an eighth p-channel MOS transistor having a current path connected between the other terminal of the current path of said sixth MOS transistor and the current output node of said reference current source and having a gate supplied with the sixth segment selection signal which is an inverted signal of the fifth segment selection signal.

8. A converter according to claim 7, wherein said selection signal output means supplies to ones of said plurality of current source cells fixed-level signals serving as complementary signals for controlling selection of a given row and a row adjacent to the given row, and wherein said selection signal output means supplies to others of said plurality of current source cells fixed-level signals serving as complementary signals for controlling selection of a column, and wherein said selection signal output means supplies a given signal obtained by decoding a digital input signal and a complementary signal complementary to the given signal to remaining current source cells.

9. A current segment type D to A converter, comprising:
   current source cells arranged in a matrix form; and
   selection signal output means for decoding a digital input signal to generate a first control signal for controlling selection of a given row of said current source cells, a second control signal for controlling selection of a row subsequent to the given row, and a third control signal for controlling selection of a column, and for supplying the first, second and third control signals to said current source cells,
   wherein each of said current source cells includes a first transistor having a current path one terminal of which is connected to an output terminal and having a gate to which a voltage higher than a threshold voltage of said first transistor is applied, a second transistor having a current path one terminal of which is connected to another terminal of the current path of said first transistor and having a gate supplied with the third control signal, a third transistor having a current path one terminal of which is connected to another terminal of the current path of said second transistor and having a gate supplied with the first control signal, a fourth transistor having a current path one terminal of which is connected to the other terminal of the current path of said first transistor and having a gate supplied with the second control signal, and constant current means connected to another terminal of the current path of said third transistor and another terminal of the current path of said fourth transistor, for causing a constant current to flow.

10. A current segment type D to A converter, comprising:
    current source cells arranged in a matrix form; and
    selection signal output means for decoding a digital input signal to generate complementary first and second control signals for controlling selection of a given row of said current source cells, complementary third and fourth control signals for controlling selection of a row subsequent to the given row, and complementary fifth and sixth control signals for controlling selection of a column, and for supplying the first, second, third, fourth, fifth and sixth control signals to said current source cells,
    wherein each of said current source cells includes a first transistor having a current path one terminal of which is connected to a first output terminal and having a gate to which a voltage higher than a threshold voltage of said first transistor is applied, a second transistor having a current path one terminal of which is connected to a second output terminal and having a gate to which a voltage higher than a threshold voltage of the second transistor is applied, a third transistor having a current path one terminal of which is connected to another terminal of the current path of said first transistor and having a gate supplied with the fifth control signal, a fourth transistor having a current path one terminal of which is connected to another terminal of the current path of said third transistor and having a gate supplied with the first control signal, a fifth transistor having a current path one terminal of which is connected to the other terminal of the current path of said first transistor and having a gate supplied with the third control signal, a sixth transistor having a current path one terminal of which is connected to another terminal of the current path of said second transistor and having a gate supplied with the fourth control signal which is an inverted signal of the third control signal, a seventh transistor having a current path one terminal of which is connected to another terminal of the current path of said sixth transistor and having a gate supplied with the second control signal which is an inverted signal of the first control signal, an eighth transistor having a current path one terminal of which is connected to the other terminal of the current path of said sixth transistor and having a gate supplied with the sixth control signal which is an inverted signal of the fifth control signal, and constant current means connected to another terminal of the current path of said fourth transistor, another terminal of the current path of said fifth transistor, another terminal of the current path of said seventh transistor, and another terminal of the current path of said eighth transistor, for causing a constant current to flow.

* * * * *

UNITED STATES PATENT AND TRADEMARK OFFICE
CERTIFICATE OF CORRECTION

PATENT NO. : 5,254,994

DATED : October 19, 1993

INVENTOR(S) : Hiroshi Takakura et al.

It is certified that error appears in the above-indentified patent and that said Letters Patent is hereby corrected as shown below:

Title page, item [54] and column 1, lines 2 and 3, change "USE" to --USED-- and change "AND" to --TO--.

Claim 7, column 14, line 28, change "cell" to --cells--.

Signed and Sealed this

Twenty-third Day of August, 1994

Attest:

BRUCE LEHMAN

*Attesting Officer*   *Commissioner of Patents and Trademarks*